United States Patent [19]

Hwang et al.

[11] Patent Number: 5,587,614
[45] Date of Patent: Dec. 24, 1996

[54] MICROPLANARIZATION OF ROUGH ELECTRODES BY THIN AMORPHOUS LAYERS

[75] Inventors: Chorng-Lii Hwang, Wappingers Falls, N.Y.; Clarence W. Teng, Plano, Tex.

[73] Assignee: Texas Instruments Incorporated, Dallas, Tex.

[21] Appl. No.: 473,807

[22] Filed: Jun. 7, 1995

Related U.S. Application Data

[62] Division of Ser. No. 397,001, Mar. 1, 1995, abandoned.

[51] Int. Cl.$^6$ .............................. H01L 27/02; H01L 27/00
[52] U.S. Cl. ............................. 257/532; 257/311; 148/33; 437/60
[58] Field of Search ..................... 257/296, 306, 257/309, 311, 532; 437/60; 148/33, 33.2, 33.3, 33.4, 33.5

[56] References Cited

U.S. PATENT DOCUMENTS

| | | | |
|---|---|---|---|
| 4,737,474 | 12/1988 | Price et al. | 437/200 |
| 4,931,897 | 6/1990 | Tsukamoto et al. | 361/313 |
| 5,376,576 | 12/1994 | Moon et al. | 437/52 |
| 5,411,912 | 5/1995 | Sakamoto | 257/296 |

FOREIGN PATENT DOCUMENTS

| | | | |
|---|---|---|---|
| 2-72658 | 3/1990 | Japan | 257/539 |
| 5-110023 | 4/1993 | Japan | 257/539 |

*Primary Examiner*—Donald L. Monin, Jr.
*Attorney, Agent, or Firm*—W. James Brady, III; Richard L. Donaldson

[57] ABSTRACT

A method of improving the dielectric properties of a thin dielectric disposed on a polycrystalline material, a method of forming a capacitor therewith and the capacitor. An electrode (17) having a polycrystalline material surface having voids (23) extending to the surface, preferably silicon, is provided. A layer of an amorphous form of the material (19) having a thickness of from about 20 Å to about 500 Å is formed over the surface with the amorphous layer disposed within the voids. A thin layer of a dielectric (21) is formed over the amorphous layer and, in the fabrication of a capacitor, a layer of electrical conductor (25) is provided which is spaced from the material over the dielectric. A microcontaminant can be disposed between the polycrystalline material surface and the amorphous layer.

7 Claims, 1 Drawing Sheet

MICROPLANARIZATION OF ROUGH ELECTRODES BY THIN AMORPHOUS LAYERS

This is a division of application Ser. No. 08/397,001, filed Mar. 1, 1995, now abandoned.

BACKGROUND OF THE INVENTION

1. Field of the Invention

This invention relates to planarization of surfaces exhibiting a grain boundary and, more specifically, to planarization of electrode surfaces in integrated circuits electrodes.

2. Brief Description of the Prior Art

As the size of components in integrated circuits decreases, new problems continually occur which were not encountered with larger dimension components. In the case of the next generations of dynamic random access memories (DRAMs) which are now under development, capacitors are required having dielectric layers as thin as 40 Å and possibly even less equivalent oxide thickness. If reoxided nitride (a deposited thin nitride followed by oxidation of this nitride) thin dielectric films are used, the physical thickness will be from about 40 to about 60 Å.

Polycrystalline materials, such as polysilicon and polycrystalline metals, which are generally used as capacitor electrodes in integrated circuits, generally exhibit grain boundary. Such materials exhibit surface voids and surface irregularities at the grain boundaries. The term "voids" as used herein is defined to include voids in its standard usage as well as a physical or lattice mismatch (i.e., the boundary between two grains with a different lattice orientation). At thicknesses in the range as low as about 40 Å, the sensitivity of the dielectric strength to the surface roughness of the electrode will be high. When polycrystalline materials are used as electrodes in conjunction with such thin dielectric layers, such as, for example, in the fabrication of capacitors in integrated circuits, the integrity and dielectric strength of the fabricated capacitors degrade to some extent, depending upon the thickness of the dielectric layers and the surface roughness of the polycrystalline electrodes. Ultrathin dielectric films, such as, for example, nitride films as thin as 40 to 60 Å show obvious degradation in dielectric properties such as leakage, gate oxide integrity or breakdown (GOI), time dependent dielectric breakdown (TDDB) and defect density when deposited on polysilicon compared to deposition thereof on single crystal silicon substrates.

It has been suggested to use amorphous silicon in place of the polycrystalline silicon to avoid the problems caused by the grain boundaries. The problem with this approach is that the amorphous silicon becomes polycrystalline when exposed to the temperatures experienced during semiconductor fabrication.

SUMMARY OF THE INVENTION

In accordance with the present invention, the above noted problems of the prior art are minimized by providing an electrically conductive polycrystalline electrode wherein the surface of the polycrystalline electrode is coated with a thin (from about 2 nanometers [20 Å] to about 50 nanometers [500 Å] and preferably 5 nanometers [50 Å]) amorphous layer of the same material as the original polycrystalline electrode after all of the high temperature (above about 900° C.) steps of the fabrication process have been completed. The amorphous material fills or seals off the voids as defined hereinabove between the grain boundaries, rounds off sharp edges around the grain boundaries and planarizes the surface structure on a microscopic basis. The dielectric properties of a thin (from about 2 nanometers [20 Å] to about 10 nanometers [100 Å] and preferably 4 nanometers [40 Å]) dielectric deposited over the amorphous material, such as leakage, GOI, TDDB, defect density, etc. show great improvement.

If the entire structure with amorphous material over the polycrystalline electrode is subjected to high temperature, i.e., above about 900° C., such temperatures may crystallize the thin amorphous layer. Some treatment, such as exposure to the atmosphere or wet clean up steps can be introduced between the steps of forming the polycrystalline electrode and the deposition of the amorphous material layer thereon. This treatment forms a layer of native oxide (in the range of 0.3 nanometers) between the polycrystalline electrode and the amorphous layers which prevents the amorphous layer from epitaxially crystallizing on the crystal grains of the original polysilicon electrodes with only small grains being formed, thereby avoiding planarization problems which might occur with the reintroduction of voids had epitaxial growth taken place.

The surface structure formed in accordance with the present invention is much smoother than the original polycrystalline structure. Also, for this reason, thick amorphous layers are not preferred because thick layers will form larger grains. The microscopic uniformity of the dielectric films will also be improved when provided in conjunction with the present invention.

In addition, it is known that "rough polysilicon" increases leakage through dielectric films thereon by one to two orders of magnitude. The invention as described above minimizes problems caused due to voids or gaps and sharp edges in the polycrystalline surface structure when any thin film is then deposited thereon. In addition, there is less problem with the formation of native oxide since amorphous silicon forms the native less rapidly than does doped polycrystalline silicon with the amorphous silicon being the exposed portion of the electrode.

DESCRIPTION OF THE PREFERRED EMBODIMENT

Figure 1:
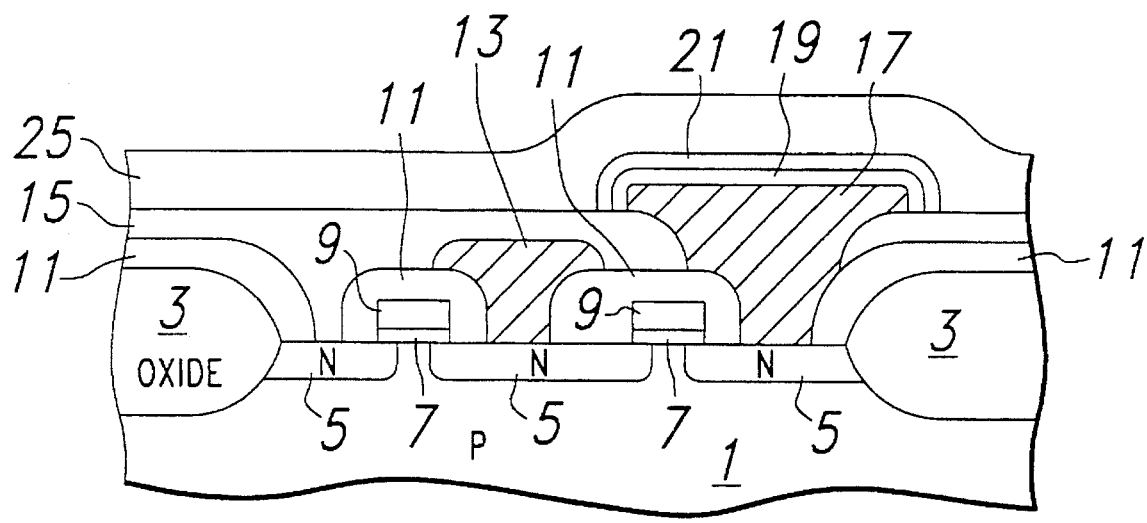
FIG. 1 is a cross sectional view of a memory element of a DRAM fabricated in accordance with the present invention.

Referring first to FIG. 1, there is shown a cross sectional view of a DRAM memory element which includes a P-type substrate 1, oxide isolation 3 and N-type regions 5 formed in the substrate. Gate oxide regions 7 are formed between the N-type regions 5 with gate electrodes 9 thereover. Dielectric regions 11, generally of silicon dioxide are formed over the oxide isolation 3 and the gate electrodes 9. A bit line 13 is formed in contact with the central N-type region 5 and a further dielectric layer 15 if formed thereover. A capacitor electrode 17 of doped polycrystalline silicon is formed in contact with one of the remaining N-type regions 5. The arrangement as demonstrated to this point is in the prior art and is fabricated in accordance with standard prior art techniques.

Figure 2:
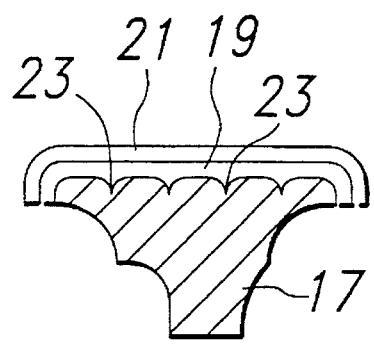
FIG. 2 is an enlarged view of the capacitor structure with amorphous layer and dielectric thereon in accordance with the present invention.

Referring now to FIGS. 1 and 2 wherein FIG. 2 is an enlargement of a portion of FIG. 1, there is shown the polycrystalline silicon electrode 17 with gaps or voids 23 and sharp edges at the surface grain boundaries thereof resulting from the grain structure. A thin, about 5 nanometer, layer of amorphous silicon 19 is then deposited by, for example, low pressure chemical vapor deposition (LPCVD) techniques with $SiH_4$ over the polycrystalline silicon electrode 17 and fills and/or seals the voids or gaps 23 and thereby also rounds off the sharp edges in the surface of the polycrystalline silicon and thereby provides an essentially planarized surface of silicon.

The capacitor fabrication portion of the process flow is completed by providing a thin dielectric layer 21 of silicon nitride, silicon dioxide, silicon oxynitride or other appropriate dielectric material having a thickness of 40 Å over the amorphous layer 19 in standard manner and then providing an electrical conductor 25, preferably but not limited to doped polycrystalline silicon, a polycide such as, for example, tungsten silicide or titanium silicide or a metal such as, for example, tungsten over the dielectric layer.

In accordance with a second embodiment of the invention, prior to the step of forming the amorphous material layer, in the case of, for example, a polysilicon base for the amorphous layer, the exposed polysilicon is microcontaminated to provide a small amount of contamination thereon which is mainly native oxide having a thickness from about 0.2 to about 1.0 nanometers by exposing the polysilicon in the air, for example. This treatment prevents the amorphous layer from epitaxially crystallizing on the crystal grains of the original polysilicon electrodes with only small grains being formed, thereby avoiding planarization problems which might occur with the reintroduction of voids had epitaxial growth taken place.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A capacitor structure for an integrated circuit comprising:

(a) an electrode having a polycrystalline material surface having voids extending to said surface;

(b) a first thin layer of a dielectric over the polycrystalline material;

(c) a layer of an amorphous form of said material over said first thin layer, the amorphous layer disposed within said voids;

(d) a second thin layer of a dielectric over said amorphous layer; and (e) a layer of electrical conductor spaced from said material over said second thin layer.

2. The capacitor of claim 1 wherein said material is silicon.

3. The capacitor of claim 1 wherein the amorphous layer has a thickness of from about 20 Å to about 500 Å.

4. The capacitor of claim 2 wherein the amorphous layer has a thickness of from about 20 Å to about 500 Å.

5. The capacitor of claim 1 in which said first thin layer is an oxide layer.

6. The capacitor of claim 5 in which said oxide layer has a thickness in the range from about 0.2 to about 1.0 nanometers.

7. The capacitor of claim 1 in which said first thin layer has a thickness in the range from about 0.2 to about 1.0 nanometers.

* * * * *